(12) United States Patent
Hasegawa

(10) Patent No.: US 6,317,861 B1
(45) Date of Patent: Nov. 13, 2001

(54) DELAY VERIFICATION DEVICE FOR LOGIC CIRCUIT AND DELAY VERIFICATION METHOD THEREFOR

(75) Inventor: Takumi Hasegawa, Tokyo (JP)

(73) Assignee: NEC Corporation, Tokyo (JP)

( * ) Notice: Subject to any disclaimer, the term of this patent is extended or adjusted under 35 U.S.C. 154(b) by 766 days.

(21) Appl. No.: 08/635,197

(22) Filed: Apr. 19, 1996

(30) Foreign Application Priority Data

Apr. 20, 1995 (JP) .................................................... 7-095402

(51) Int. Cl.[7] .................................................. G06F 17/50
(52) U.S. Cl. ...................................................... 716/6; 716/5
(58) Field of Search .................................. 364/488–491; 716/5, 6

(56) References Cited

U.S. PATENT DOCUMENTS 5,210,700    5/1993    Tom ...................................... 364/489

FOREIGN PATENT DOCUMENTS

| 64-66578 | 3/1989 | (JP) . |
| 2-231646 | 9/1990 | (JP) . |
| 3-292573 | 12/1991 | (JP) . |

OTHER PUBLICATIONS

Ramachandran et al. "Combined Topological and Functionality Based Delay Estimation Using a Layout–Driven Approach for High–Level Application," IEEE, 1994, pp. 1450–1460.*

Murakfa et al. "Concurrent Logic and Layout Design System Jr. High Performance LSIS," IEEE, May 1995, pp. 465–468.*

Jyn et al. "Prediction of Interconnect Delay in Logic Synthesis," IEEE, Mar. 1995, 411–415.*

Ramachandran et al. "Combined Topological and Functionality Based Delay Estimatimation Using a Layout–Driven Approach for High–level Application," IEEE, 1992, pp. 72–78.*

Chen et al. "A Performance Driven Logic Synthesis Systems Using Delay Estimator," IEEE, 1994, pp. 88–92.*

Jan Madsen "Delay Estimation for CMOS Functional Cells," IEEE, 1991, pp. 101–105.*

Wehn et al "A New Approach to Timing Driven Partitioning of Combinational Logic," IEEE, 1991, pp. 96–101.*

Ku et al. "Synthesis of Delay–Verifiable Two–Level Circuits," IEEE, 1994, pp. 297–301.*

* cited by examiner

Primary Examiner—Matthew Smith
Assistant Examiner—Vuthe Siek
(74) Attorney, Agent, or Firm—Foley & Lardner

(57) ABSTRACT

A delay verification device includes a circuit information storing unit for storing circuit information of a logic circuit, a before layout designing delay information storing unit for storing before layout designing delay information on a delay time between circuit elements predicted before layout designing, an after layout designing delay information storing unit for storing after layout designing delay information on a delay time between circuit elements computed after layout designing of the logic circuit, a difference extracting unit for comparing the before layout designing delay information and the after layout designing delay information to extract and register difference information on a portion of the logic circuit, whose delay time of the after layout designing delay information is longer than that of the before layout designing delay information, a tracing unit for searching paths of the logic circuit to extract a path including a portion of the logic circuit corresponding to the difference information, an extracted circuit information storing unit for storing an extracted circuit information, and a delay analyzing unit for analyzing delays of the logic circuit based on the extracted circuit information and the after layout designing delay information.

13 Claims, 7 Drawing Sheets

FIG. 4

| ARC | DELAY TIME |
|---|---|
| 312 | 2 |
| 313 | 4 |
| 314 | 4 |
| 315 | 2 |
| 316 | 3 |
| 317 | 3 |
| 318 | 3 |
| 319 | 3 |
| 320 | 2 |
| 321 | 2 |

| ARC | DELAY TIME |
|---|---|
| 312 | 2 |
| 313 | 2 |
| 314 | 4 |
| 315 | 2 |
| 316 | 3 |
| 317 | 3 |
| 318 | 3 |
| 319 | 3 |
| 320 | 3 |
| 321 | 2 |

30

DELAY VERIFICATION DEVICE FOR LOGIC CIRCUIT AND DELAY VERIFICATION METHOD THEREFOR

BACKGROUND OF THE INVENTION

1. Field of the Invention

The present invention relates to a delay verification device for a logic circuit represented according to graph algorithms and a delay verification method therefor and, more particularly, to a delay verification device which is capable of conducting delay verification processing for a large-scale logic circuit at a high speed and a delay verification method therefor.

2. Description of the Related Art

One of the one conventional techniques related to delay verification of a logic circuit of this kind is disclosed in, for example, Japanese Unexamined Patent Publication (Kokai) No. Heisei 3-292573, entitled "Logic Design Verification System". This literature recites a delay verification technique for converting initial design data regarding a logic circuit into a logic circuit, searching the converted logic circuit for signal paths from its input to its output to compute a delay time of each signal path, and comparing the delay time as a verification result with a preset standard delay time to modify the initial design data based on the determination results.

Because the above-described conventional logic design verification system automatically conducts all the processing for delay verification of logic initial design data as well as analyses and modification, accurate and efficient logic verification is possible without the operator's assistance.

The system, however, has a drawback that processing time is too long to verify delays of a large-scale logic circuit because the system conducts delay verification for the entire logic circuit whose delay time is to be verified.

Among other techniques regarding delay verification of logic circuits are, for example, those disclosed in Japanese Unexamined Patent Publication (Kokai) No. Showa 64-66578, entitled "Delay Analysis System for Logic Circuit", and Japanese Unexamined Patent Publication (Kokai) No. Heisei 2-231646, entitled "Delay Analysis System for Logic Circuit". These literatures recite a delay verification technique for determining whether a path whose delay time exceeds a limiting value is a meaningless redundant path on a logic circuit according to the path activation method and removing a redundant path from a delay analysis result list according to the determination results to reduce a time required for determining whether a delay analysis result is good or bad and a technique for displaying only the components that are contributing factors to cause a delay time of a path to exceed a delay time limiting value to simplify modification.

The above-described conventional techniques have drawbacks that speed-up of delay verification after layout has a limit because none of these techniques makes the most of the delay state of a logic circuit prior to layout.

SUMMARY OF THE INVENTION

An object of the present invention is to eliminate the above-described conventional drawbacks and provide a delay verification device capable of conducting high-speed delay verification for even a large-scale logic circuit while making the most of delay results obtained prior to layout, and a delay verification method therefor.

According to the first aspect of the invention, a delay verification device for performing delay verification for a logic circuit may comprise:

circuit information storing means for storing circuit information on a logic circuit, a target for delay verification;

first delay information storing means for storing first delay information on a delay time between circuit elements predicted before layout designing of said logic circuit;

second delay information storing means for storing second delay information on a delay time between circuit elements computed after layout designing of said logic circuit in consideration of the designing results;

difference extracting means for comparing said first delay information and said second delay information to extract and register difference information on a portion, out of the components of said logic circuit, whose delay time of said second delay information is longer than that of said first delay information;

extracted circuit information obtaining means for searching paths of said logic circuit based on said circuit information and said difference information, extracting a path including a portion of said logic circuit corresponding to said difference information and storing the extracted path as extracted circuit information; and delay analyzing means for analyzing delays of said logic circuit based on said extracted circuit information and said second delay information.

In the preferred construction, the circuit information storing means stores, as said circuit information, at least logic circuit information and delay information on a delay time of an arc corresponding to the internal part of a circuit element in question.

In another preferred construction, the first delay information storing means stores a delay time of an arc corresponding to a connection line between a circuit element and each terminal, which delay time is computed before layout designing of said logic circuit according to a predetermined relational expression based on information of an arc which is a flow of an electric signal between nodes including an external terminal of said logic circuit to be processed and a terminal of each circuit element, and the second delay information storing means stores a delay time of an arc corresponding to a connection line between a circuit element and each terminal which delay time is computed after layout designing of said logic circuit according to a predetermined relational expression based on said arc information of said logic circuit to be processed and the layout of said logic circuit.

In another preferred construction, the first delay information storing means stores a delay time of an arc corresponding to a connection line between a circuit element and each terminal, which delay time is computed before layout designing of said logic circuit according to a predetermined relational expression based on information of an arc which is a flow of an electric signal between nodes including an external terminal of said logic circuit to be processed and a terminal of each circuit element, the second delay information storing means stores a delay time of an arc corresponding to a connection line between a circuit element and each terminal, which delay time is computed after layout designing of said logic circuit according to a predetermined relational expression based on said arc information of said logic circuit to be processed and the layout of said logic circuit, the difference extracting means compares said first delay information and said second delay information to extract and register, as difference information, an arc whose delay time of said second delay information is longer than that of said first delay information, out of the arcs in said arc information of said logic circuit to be processed, and the extracted circuit information obtaining means searches, with respect to an arc extracted as said difference information, a path according to said circuit information stored in said circuit information storing means, extracts said arc as a circuit element, and a node and an arc as signal path elements on a signal path running through the arc and correlates the arc and node with the delay time of the arc to obtain extracted circuit information.

According to the second aspect of the invention, a delay verification method for verifying delays of a logic circuit may comprise the steps of:

a first step of storing circuit information on a logic circuit as a target for delay verification, a second step of storing first delay information on a delay time between circuit elements predicted before layout designing of said logic circuit, a third step of storing second delay information on a delay time between circuit elements computed after layout designing of said logic circuit in consideration of the results of the designing, a fourth step of comparing said first delay information and said second delay information to extract and register difference information on a portion having a delay time of said second delay information longer than that of said first delay information, out of the components of said logic circuit, a fifth step of searching paths of said logic circuit based on said circuit information and said difference information, extracting a path including a portion of said logic circuit corresponding to said difference information and storing the extracted path as extracted circuit information, and a six step of analyzing delays of said logic circuit based on said extracted circuit information and said second delay information.

In the preferred construction, the second step of storing the first delay information comprises a step of computing a delay time of an arc corresponding to a connection line between a circuit element and each terminal according to a predetermined relational expression based on information of an arc which is a flow of an electric signal between nodes including an external terminal of said logic circuit to be processed and a terminal of each circuit element, the third step of storing the second delay information comprises a step of, after layout designing of said logic circuit, computing a delay time of an arc corresponding to a connection line between a circuit element and each terminal according to a predetermined relational expression based on said arc information of said logic circuit to be processed and the layout of said logic circuit, and the fourth step of extracting the difference information comprises the steps of:

comparing said first delay information and said second delay information, and extracting, as difference information, an arc whose delay time of said second delay information is longer than that of said first delay information according to said comparison results, out of the arcs in said arc information of said logic circuit to be processed.

In another preferred construction, the second step of storing the first delay information comprises a step of computing a delay time of an arc corresponding to a connection line between a circuit element and each terminal according to a predetermined relational expression based on information of an arc which is a flow of an electric signal between nodes including an external terminal of said logic circuit to be processed and a terminal of each circuit element, the third step of storing the second delay information comprises a step of, after layout designing of said logic circuit, computing a delay time of an arc corresponding to a connection line between a circuit element and each terminal according to a predetermined relational expression based on said arc information of said logic circuit to be processed and the layout of said logic circuit, the fourth step of extracting the difference information comprises the steps of:

comparing said first delay information and said second delay information, and extracting, as difference information, an arc whose delay time of said second delay information is longer than that of said first delay information according to said comparison results, out of the arcs in said arc information of said logic circuit to be processed, and the fifth step of obtaining the extracted circuit information comprises the steps of:

with respect to an arc extracted as said difference information, searching a path according to said circuit information stored in said circuit information storing means, and extracting said arc as a circuit element, and a node and an arc as signal path elements on a signal path running through the arc according to the results of said search of the path and correlating the arc and node with a delay time of the arc to output extracted circuit information.

According to the third aspect of the invention, a computer readable memory which stores a computer program for controlling a delay verification device for performing delay verification of a logic circuit, said computer program may comprise the steps of:

a first step of storing circuit information on a logic circuit as a target for delay verification, a second step of storing first delay information on a delay time between circuit elements predicted before layout designing of said logic circuit, a third step of storing second delay information on a delay time between circuit elements computed after layout designing of said logic circuit in consideration of the results of the designing, a fourth step of comparing said first delay information and said second delay information to extract and register difference information on a portion whose delay time of said second delay information is longer than that of said first delay information, out of the components of said logic circuit, a fifth step of searching a path of said logic circuit based on said circuit information and said difference information, extracting a path including a portion of said logic circuit corresponding to said difference information and storing the extracted path as extracted circuit information, and a sixth step of analyzing delay of said logic circuit based on said extracted circuit information and said second delay information.

Other objects, features and advantages of the present invention will become clear from the detailed description given herebelow.

BRIEF DESCRIPTION OF THE DRAWINGS

The present invention will be understood more fully from the detailed description given herebelow and from the accompanying drawings of the preferred embodiment of the invention, which, however, should not be taken to be limitative to the invention, but are for explanation and understanding only.

In the drawings:

FIG. 4 is a diagram showing an example of before layout designing delay information for the logic circuit of FIG. 2 which is stored in a before layout designing delay information storing unit of the present embodiment.

FIG. 5 is a diagram showing an example of after layout designing delay information for the logic circuit of FIG. 2 which is stored in an after layout designing delay information storing unit of the present embodiment.

DESCRIPTION OF THE PREFERRED EMBODIMENT

A preferred embodiment of the present invention will be described in detail with reference to the accompanying drawings.

Figure 1:
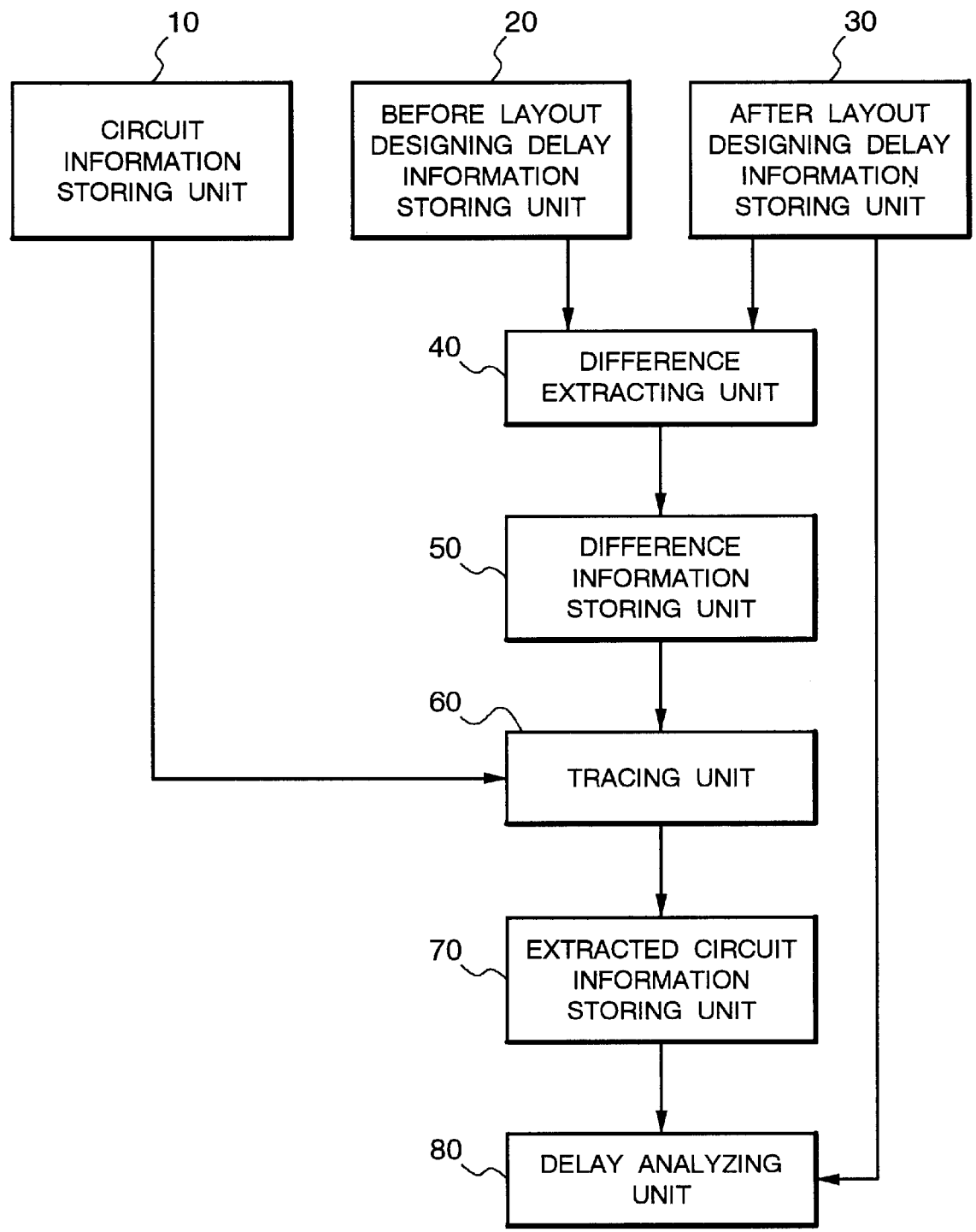
FIG. 1 is a block diagram showing structure of a delay verification device according to one embodiment of the present invention.

FIG. 1 is a block diagram showing structure of a delay verification device according to one embodiment of the present invention. The delay verification device of the present embodiment conducts provisional delay analyses based on prediction prior to layout designing of a logic circuit whose delay is to be analyzed to verify that design specification is satisfied, and then conducts main delay analyses regarding the maximum delay time based on the results of layout designing (delay calculation results).

As illustrated in the figure, the delay verification device of the present embodiment includes a circuit information storing unit 10 for storing circuit information of a logic circuit whose delay is to be verified, a before layout designing delay information storing unit 20 for storing before layout designing delay information regarding delay times between circuit elements predicted before layout design of the logic circuit is made, an after layout designing delay information storing unit 30 for storing after layout designing delay information regarding delay times between circuit elements obtained based on delay calculation results, a difference extracting unit 40 and a difference information storing unit 50 for comparing the before layout designing delay information and the after layout designing delay information to extract and register difference information, a tracing unit 60 and an extracted circuit information storing unit 70 for tracing a logic circuit based on the circuit information and the difference information to obtain extracted circuit information, and a delay analyzing unit 80 for analyzing delays based on the extracted circuit information and the after layout designing delay information. In this figure, illustration is made only of the characteristic components of the present embodiment and no illustration is made of the other components. It is apparent that the device in practice includes a processing unit for computing before layout designing delay information and after layout designing delay information and the like.

The circuit information storing unit 10, which is implemented by a memory such as a RAM and a storage device such as a magnetic disk device, stores circuit information of a logic circuit whose delay is to be analyzed. The circuit information at least includes information of an arc which is a flow of an electric signal between nodes comprised of an external terminal of the logic circuit and a terminal of each circuit element, and delay information regarding a delay time of an arc corresponding to the internal part of said each circuit element.

Figure 2:
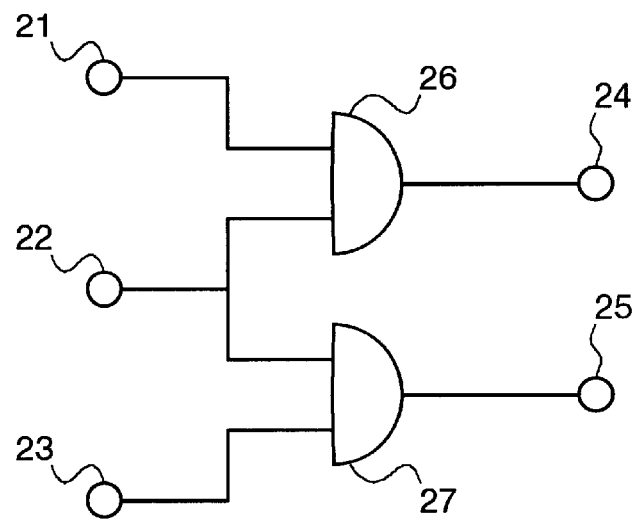
FIG. 2 is a diagram showing an example of a logic circuit whose delay is to be verified according to the present embodiment.
Figure 3:
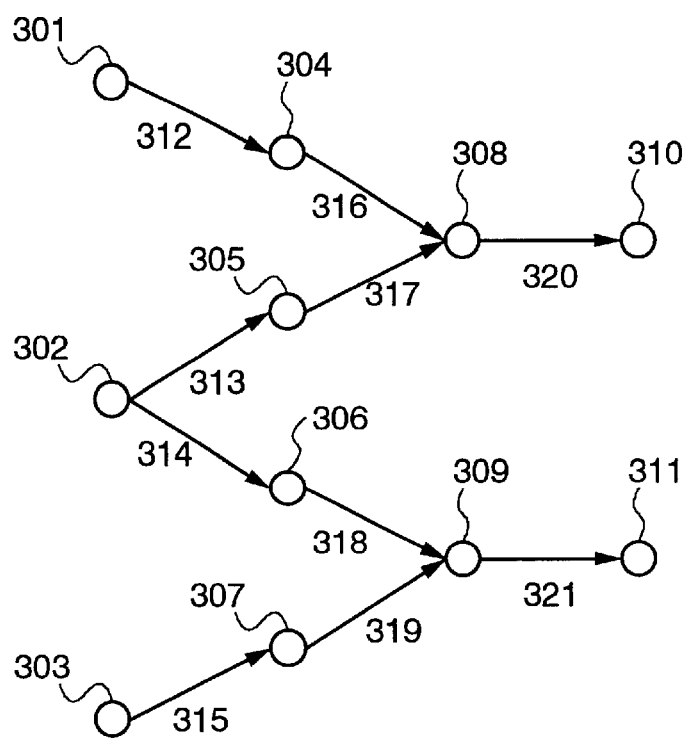
FIG. 3 is a diagram showing circuit information for the logic circuit of FIG. 2 which is stored in a circuit information storing unit of the present embodiment.

Such a logic circuit as shown in FIG. 2 for example, has three external terminals (external pins) 21 to 23 and two terminals 24 and 25 for circuit elements 26 and 27 as nodes and has such a relationship as illustrated in FIG. 3. Here, a node 301 corresponds to the external terminal 21, a node 304 to an upper input terminal of the circuit element 26, an arc 312 to a signal flow from the external terminal 21 to the circuit element 26, an arc 316 to a signal flow in the circuit element 26 from the external terminal 21 to the external terminal 24, a node 308 to an output terminal of the circuit element 26, a node 310 to the terminal 24 for the circuit element 26 and an arc 320 to a signal flow from the circuit element 26 to the terminal 24, respectively. Each node and each arc of FIG. 3 correspond to the elements of the logic circuit of FIG. 2 in the same manner. Then, the circuit information storing unit 10 stores, as circuit information, arc information regarding 11 nodes 301 to 311 and ten arcs 312 to 321 thus corresponding to the elements of the logic circuit and delay information regarding delay times of arcs corresponding to the internal parts of the circuit elements 26 and 27, that is, the arcs 316 to 319 which connect the nodes 304 to 309.

The before layout designing delay information storing unit 20, which is implemented by a memory such as a RAM and a storage device such as a magnetic disk device, stores before layout designing delay information of a logic circuit in question predicted based on such information as the number of arcs and the number of nodes prior to layout designing. In the example of execution for the above-described logic circuit shown in FIG. 2, before layout designing delay information for arcs corresponding to connection lines between each circuit element and each terminal, that is, delay times of the arcs 312, 313, 314, 315, 320 and 321 of FIG. 3, are predicted, and their values are stored. Prediction of delay times is executed and obtained by a processing unit (not shown) or the like by using such a relational expression as "predicted delay time=(the number of arcs having the same output pin) ×2." FIG. 4 shows an example of predicted delay times of the respective arcs 312 to 321 shown in FIG. 2.

The after layout designing delay information storing unit 30, which is implemented by a memory such as a RAM and a storage device such as a magnetic disk device, stores after layout designing delay information, which is a delay calculation result of a logic circuit in question obtained after layout design is made. Since the after layout designing delay information is a calculation result obtained after layout design is made, such information as wiring lengths and location of circuit elements can be taken into consideration to have higher precision than that of the before layout designing delay information. In the example of execution for the logic circuit of FIG. 2, the unit 30 stores after layout designing delay information of arcs corresponding to the connection lines between the circuit elements 26 and 27 and the respective terminals, that is, values of calculated delay times on the respective arcs 312, 313, 314, 315, 320, and 321 of FIG. 3. FIG. 5 shows an example of calculation results of the delay times on the respective arcs 312 to 321 of FIG. 2.

The difference extracting unit 40, which is implemented by a program-controlled CPU or the like, compares the before layout designing delay information stored in the before layout designing delay information storing unit 20 and the after layout designing delay information stored in the after layout designing delay information storing unit 30 to detect an arc whose delay time of the after layout designing delay information has a larger value than that of a delay time of the before layout designing delay information and stores a detected arc in the difference information storing unit 50. The flow chart of FIG. 6 shows operation of the difference extracting unit 40.

Figure 6:
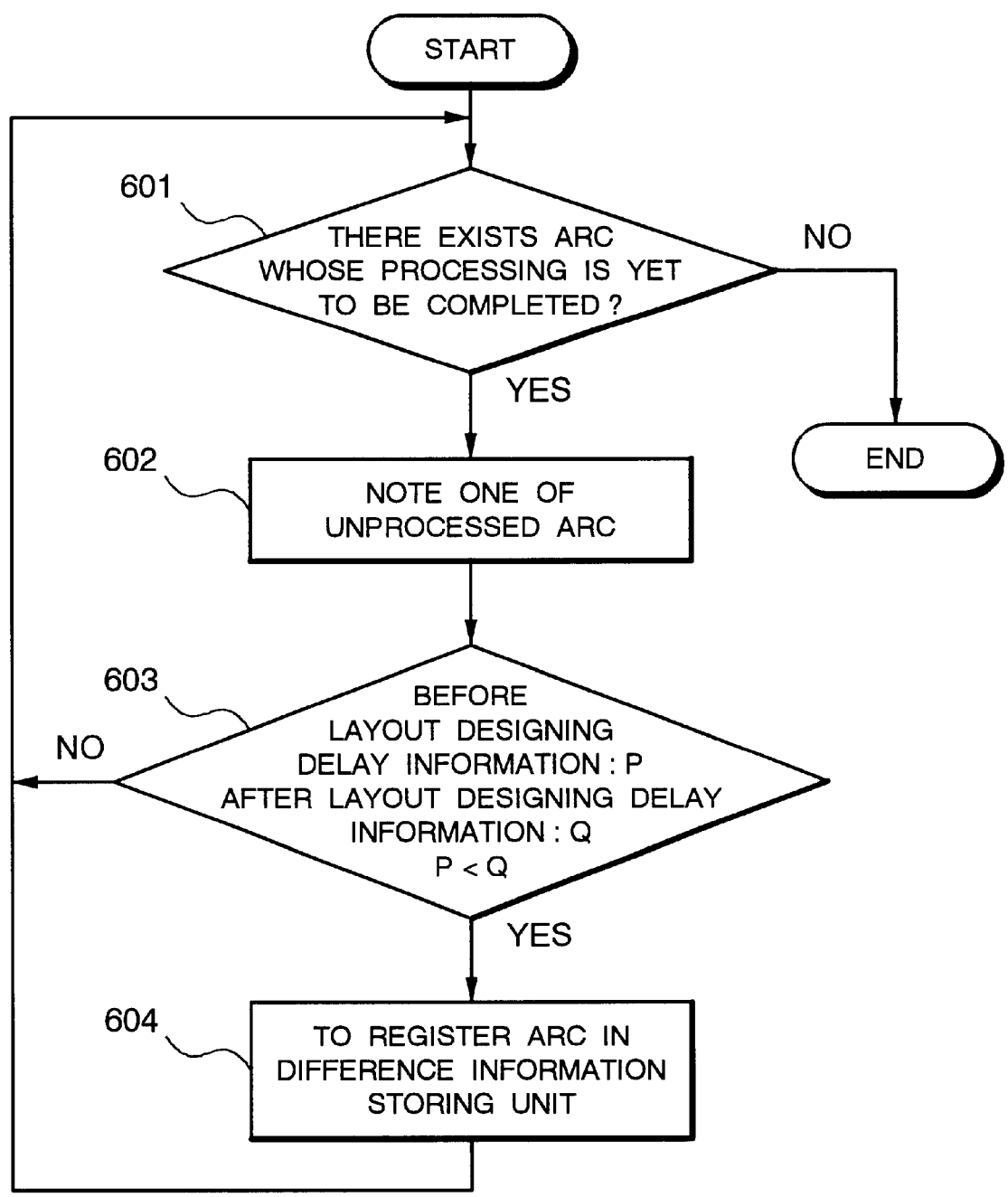
FIG. 6 is a flow chart showing operation of a difference extracting unit of the present embodiment.
Figure 7:
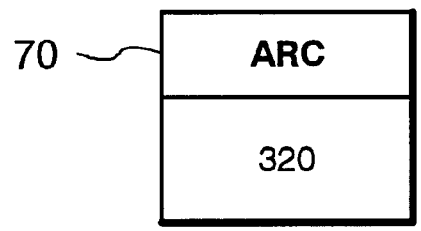
FIG. 7 is a diagram showing difference information for the logic circuit of FIG. 2 which is registered in a difference information storing unit of the present embodiment.

With reference to FIG. 6, the difference extracting unit 40 first determines whether processing is completed for all the arcs or not (Step 601) and when there exists an arc whose processing is yet to be finished, notes one of such unprocessed arcs (Step 602) and compares a delay time of the before layout designing delay information of the noted arc and a delay time of the after layout designing delay information of the same (Step 603). Then, when the delay time of the after layout designing delay information is longer, the unit 40 registers the noted arc in the difference information storing unit 50 (Step 604). Thereafter, another determination is made whether processing is completed for all the arcs or not to repeat the sample processing until processing for all the arcs is finished (Step 601). With reference to FIGS. 4 and 5, since with respect to the arc 320, the delay time of the after layout designing delay information is longer than that of the before layout designing delay information, the arc 320 is registered in the difference information storing unit 50. FIG. 7 shows an example of registration in the difference information storing unit 50.

The tracing unit 60, which is implemented by a program-controlled CPU or the like, traces target arcs stored in the difference information storing unit 50 according to the circuit information stored in the circuit information storing unit 10. Then, the unit 60 extracts an arc as a circuit element, and a node and an arc as signal path elements on a signal path running through the arc, correlates the arc and node with a delay time of the arc and registers the correlated arc and node and delay time as extracted circuit information in the extracted circuit information storing unit 70. The flow chart of FIG. 8 shows operation of the tracing unit 60.

Figure 8:
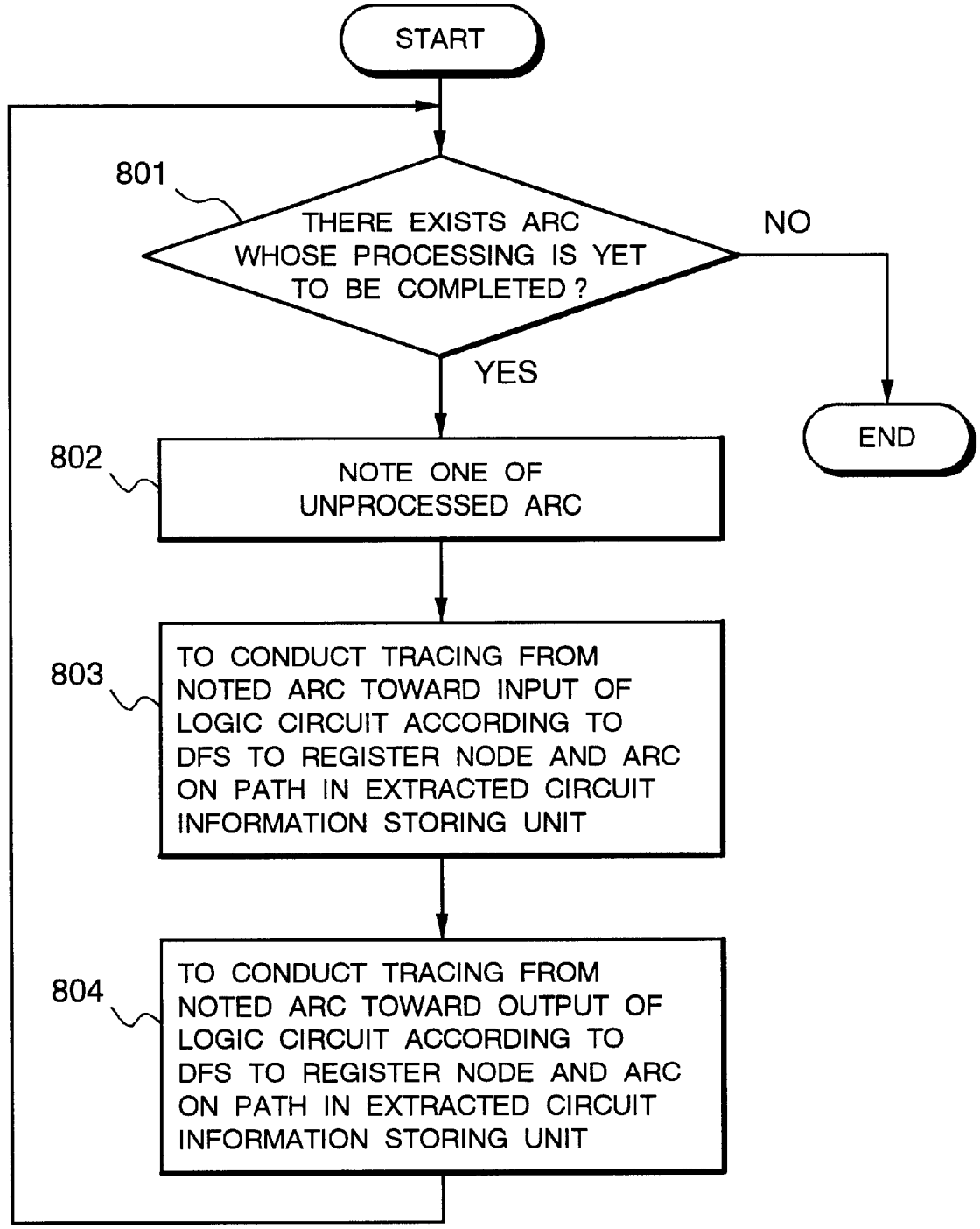
FIG. 8 is a flow chart showing operation of a tracing unit of the present embodiment.

With reference to FIG. 8, the tracing unit 60 first determines whether processing is completed for all the arcs registered in the difference information storing unit 50 (Step 801) and if there exists an arc whose processing is yet to be finished, reads one of such unprocessed arcs (Step 802). Then, referring to the circuit information stored in the circuit information storing unit 10, the unit 60 conducts tracing from the read arc toward the input to detect a node and an arc on the traced path and registers the detected node and arc in the extracted circuit information storing unit (Step 803).

Here, tracing of the circuit is carried out by depth first search. As algorithms for the depth first search, known algorithms for searching a path derived from a predetermined arc by graph algorithms can be used.

Then, tracing is conducted by the same processing, starting with the arc in question toward the output of the circuit in question to detect a node and an arc on the traced path and register the same in the extracted circuit information storing unit 70 (Step 804). Thereafter, another determination is made whether processing is completed for all the arcs registered in the difference information storing unit 50 to repeat the same processing until processing for all the arcs is finished (Step 801).

Figure 9:
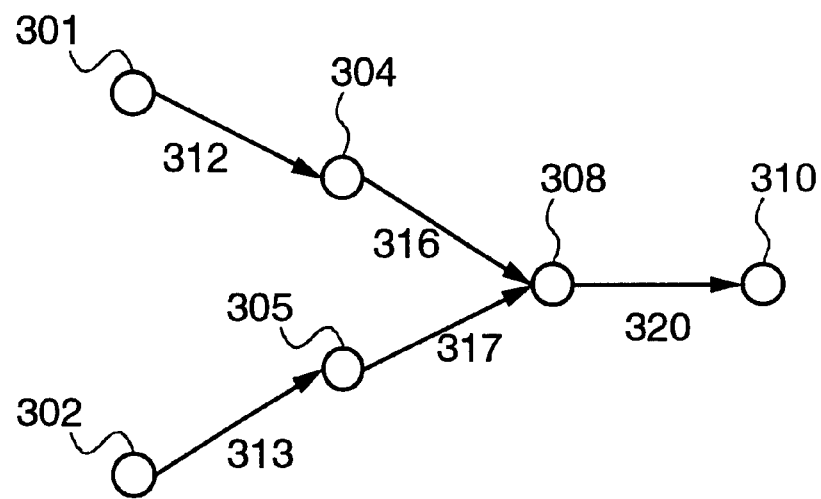
FIG. 9 is a diagram showing extracted circuit information for the logic circuit of FIG. 2 which is registered in an extracted circuit information storing unit of the present embodiment.

In the examples shown in FIGS. 3, 4, 5 and 7, since the arc 320 is set to have its delay time of the after layout designing delay information longer than that of before layout designing delay information, the arc 320, paths on signal paths running through the arc 320 which are represented by the nodes 301, 304, 308 and 310 and the arcs 312 and 316 and by the nodes 302, 305, 308 and 310 and the arcs 313 and 317, respectively, are extracted and registered in the extracted circuit information storing unit 70. FIG. 9 shows the paths to be registered in the extracted circuit information storing unit in this example.

The delay analyzing unit 80, which is implemented by a program-controlled CPU or the like, makes a delay analysis only of the extracted circuit information registered in the extracted circuit information storing unit 70 based on the after layout designing delay information stored in the after layout designing delay information storing unit 30 by a delay analysis technique using graph algorithms. In the example of FIG. 3, delay analyses are made of paths starting with the nodes 301 and 302 and ending at the node 310.

In the above-described structure, the difference information storing unit 50 and the extracted circuit information storing unit 70 are implemented by a memory such as a RAM or a storage device such as a magnetic disk device.

Figure 10:
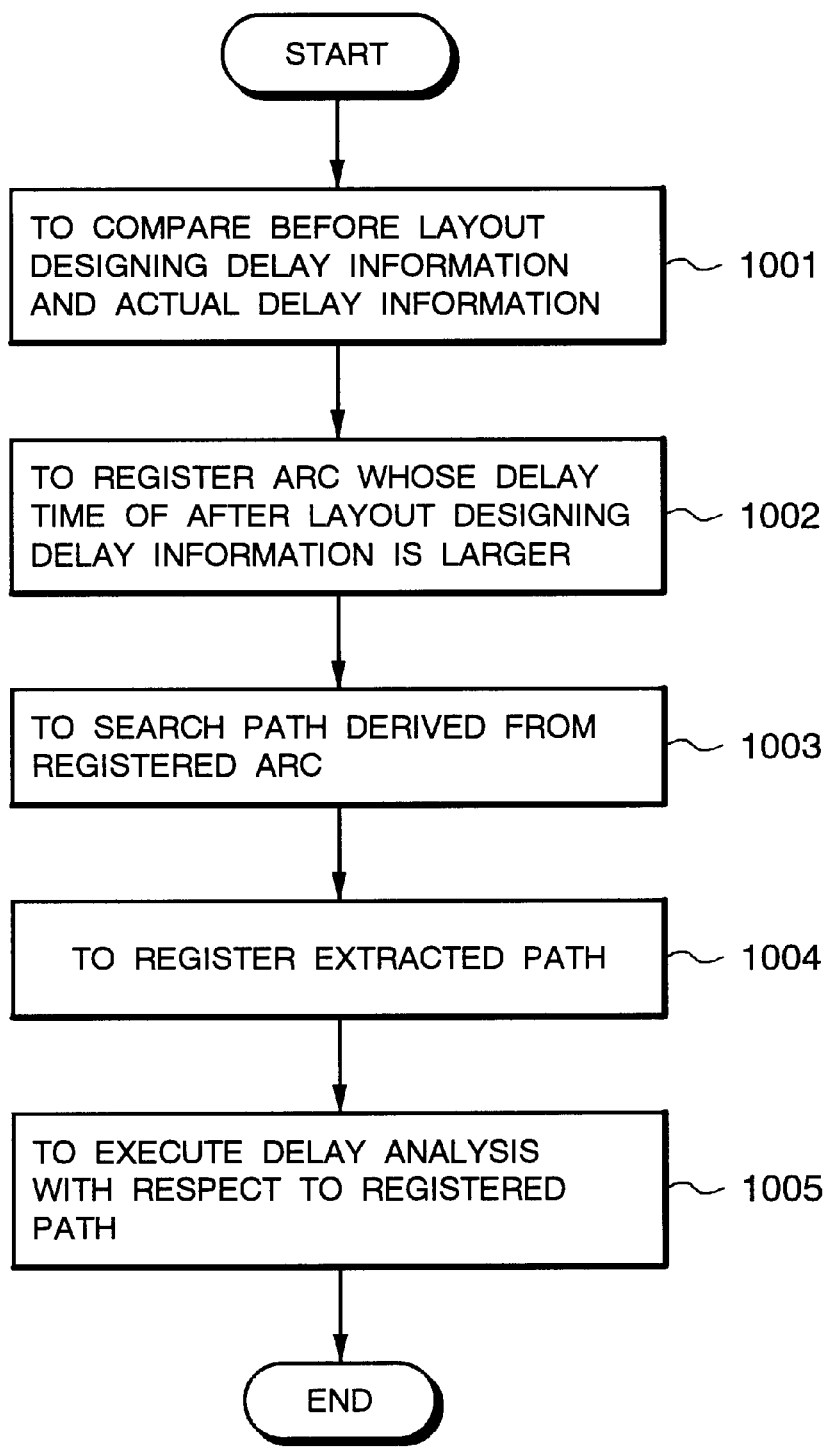
FIG. 10 is a flow chart for use in explaining operation of the present embodiment.

Next, with reference to the flow chart of FIG. 10, operation of the present embodiment will be described.

In the initial state, circuit information is stored in the circuit information storing unit 10, before layout designing delay information in the before layout designing delay information storing unit 20 and after layout designing delay information in the after layout designing delay information storing unit 30, respectively. In this state, the difference extracting unit 40 first compares the before layout designing delay information stored in the before layout designing delay information storing unit 20 with the after layout designing delay information stored in the after layout designing delay information storing unit 30 (Step 1001) and registers an arc whose delay time of the after layout designing delay information is longer than that of the before layout designing delay information in the difference information storing unit 50 (Step 1002). This allows only a path to be a target for a later delay analysis that includes an arc whose delay time of the after layout designing delay time information is longer than that of the before layout designing delay time information.

Next, the tracing unit 60 searches a path derived from an arc registered in the difference information storing unit 50 while referring to the circuit information stored in the circuit information storing unit 10 (Step 1003) to register an extracted path in the extracted circuit information storing unit 70 (Step 1004). As a result, a path whose delay is to be analyzed is specified.

Lastly, the delay analyzing unit 80 makes an analysis of a delay with respect to the path registered in the extracted circuit information storing unit 70 (Step 1005). As described in the foregoing, paths which are registered in the extracted circuit information storing unit 70 and of which delay analyses are to be made all include arcs whose delay time of the after layout disjoining delay information is longer than that of the before layout designing delay information. The delay analyzing unit 80 therefore makes no unnecessary delay analysis of a path for which sufficient delay time is assumed in the before layout designing delay information.

As described above with respect to the operation of the present embodiment, provisional delay analysis is made based on prediction prior to layout designing to verify that a logic circuit in question satisfies design specification at the stage of the prediction. When making delay analyses with respect to the maximum delay time based on delay calculation results obtained after the layout designing, therefore, delay analysis based on the after layout designing delay information included in the after layout designing delay information storing unit 30 is only necessary for the extracted circuit information included in the extracted circuit information storing unit 70, that is, for a path with a delay time calculated after layout designing longer than that calculated prior to layout designing.

As described in the foregoing, the present invention makes the most of delay time calculation results obtained prior to layout to make it possible to conduct delay verification only for a limited part requiring delay verification of a logic circuit without the need to conduct delay verification with respect to the entire logic circuit. The present invention therefore enables drastic reduction of processing time required for delay verification as compared with that required for conducting delay verification for the entire logic circuit.

In particular, the larger the scale of a logic circuit whose delay is to be verified becomes, the larger a part of the circuit becomes for which prediction results prior to layout are used and whose delay is therefore not verified in practice, whereby more marked effect of reducing a processing time can be achieved.

Although the invention has been illustrated and described with respect to an exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodied which can be embodies within a scope encompassed and equivalents thereof with respect to the feature set out in the appended claims.

What is claimed is:

1. A delay verification device for performing delay verification for a logic circuit having circuit elements, comprising:
    circuit information storing means for storing circuit information on said logic circuit;
    first delay information storing means for storing first delay information on a delay time between said circuit elements predicted before layout designing of said logic circuit;
    second delay information storing means for storing second delay information on a delay time between said circuit elements computed after layout designing of said logic circuit;
    difference extracting means for comparing said first delay information and said second delay information, and for extracting difference information on a portion of said logic circuit whose delay time of said second delay information is longer than that of said first delay information;
    extracted circuit information obtaining means for searching paths of said logic circuit based on said circuit information and said difference information, extracting a path including said portion of said logic circuit, and storing the extracted path as extracted circuit information; and
    delay analyzing means for analyzing delays of said extracted path using said extracted circuit information.

2. The delay verification device as set forth in claim 1, wherein said circuit information storing means stores, as said circuit information, at least logic circuit information and delay information on a delay time of an arc corresponding to the internal part of a circuit element in question.

3. The delay verification device as set forth in claim 1, wherein said first delay information storing means stores a delay time of an arc corresponding to a connection line between a circuit element and each terminal which delay time is computed before layout designing of said logic circuit according to a predetermined relational expression based on information of an arc which is a flow of an electric signal between nodes including an external terminal of said logic circuit to be processed and a terminal of each circuit element.

4. The delay verification device as set forth in claim 1, wherein said second delay information storing means stores a delay time of an arc corresponding to a connection line between a circuit element and each terminal which delay time is computed after layout designing of said logic circuit according to a predetermined relational expression based on information of an arc which is a flow of an electric signal between nodes including an external terminal of said logic circuit to be processed and a terminal of each circuit element and on the layout of said logic circuit.

5. The delay verification device as set forth in claim 1, wherein
    said first delay information storing means stores a delay time of an arc corresponding to a connection line between a circuit element and each terminal which delay time is computed before layout designing of said logic circuit according to a predetermined relational expression based on information of an arc which is a flow of an electric signal between nodes including an external terminal of said logic circuit to be processed and a terminal of each circuit element, and
    said second delay information storing means stores a delay time of an arc corresponding to a connection line between a circuit element and each terminal which delay time is computed after layout designing of said logic circuit according to a predetermined relational expression based on said arc information of said logic circuit to be processed and the layout of said logic circuit.

6. The delay verification device as set forth in claim 1, wherein
    said first delay information storing means stores a delay time of an arc corresponding to a connection line between a circuit element and each terminal which delay time is computed before layout designing of said logic circuit according to a predetermined relational expression based on information of an arc which is a flow of an electric signal between nodes including an external terminal of said logic circuit to be processed and a terminal of each circuit element, said second delay information storing means stores a delay time of an arc corresponding to a connection line between a circuit element and each terminal which delay time is computed after layout designing of said logic circuit according to a predetermined relational expression based on said arc information of said logic circuit to be processed and the layout of said logic circuit, and said difference extracting means compares said first delay information and said second delay information to extract and register, as difference information, an arc whose delay time of said second delay information is longer than that of said first delay information, out of the arcs in said arc information of said logic circuit to be processed.

7. The delay verification device as set forth in claim 1, wherein said first delay information storing means stores a delay time of an arc corresponding to a connection line between a circuit element and each terminal which delay time is computed before layout designing of said logic circuit according to a predetermined relational expression based on information of an arc which is a flow of an electric signal between nodes including an external terminal of said logic circuit to be processed and a terminal of each circuit element, said second delay information storing means stores a delay time of an arc corresponding to a connection line between a circuit element and each terminal which delay time is computed after layout designing of said logic circuit according to a predetermined relational expression based on said arc information of said logic circuit to be processed and the layout of said logic circuit, said difference extracting means compares said first delay information and said second delay information to extract and register, as difference information, an arc whose delay time of said second delay information is longer than that of said first delay information, out of the arcs in said arc information of said logic circuit to be processed, and said extracted circuit information obtaining means searches, with respect to an arc extracted as said difference information, a path according to said circuit information stored in said circuit information storing means, extracts said arc as a circuit element, and a node and an arc as signal path elements on a signal path running through the arc and correlates the arc and node with the delay time of the arc to obtain extracted circuit information.

8. A delay verification method for verifying delays of a logic circuit having circuit elements, comprising the steps of:

a first step of storing circuit information on said logic circuit as a target for delay verification;

a second step of storing first delay information on a delay time between said circuit elements predicted before layout designing of said logic circuit;

a third step of storing second delay information on a delay time between said circuit elements computed after layout designing of said logic circuit;

a fourth step of comparing said first delay information and said second delay information to extract difference information on a portion of said logic circuit having a delay time of said second delay information longer than that of said first delay information;

a fifth step of searching paths of said logic circuit based on said circuit information and said difference information, extracting a path including said portion of said logic circuit, and storing the extracted path as extracted circuit information; and a sixth step of analyzing delays of said extracted path using said extracted circuit information.

9. The delay verification method as set forth in claim 8, wherein said second step of storing the first delay information comprises a step of computing a delay time of an arc corresponding to a connection line between a circuit element and each terminal according to a predetermined relational expression based on information of an arc which is a flow of an electric signal between nodes including an external terminal of said logic circuit to be processed and a terminal of each circuit element, and said third step of storing the second delay information comprises a step of, after layout designing of said logic circuit, computing a delay time of an arc corresponding to a connection line between a circuit element and each terminal according to a predetermined relational expression based on said arc information of said logic circuit to be processed and the layout of said logic circuit.

10. The delay verification method as set forth in claim 8, wherein said second step of storing the first delay information comprises a step of computing a delay time of an arc corresponding to a connection line between a circuit element and each terminal according to a predetermined relational expression based on information of an arc which is a flow of an electric signal between nodes including an external terminal of said logic circuit to be processed and a terminal of each circuit element, said third step of storing the second delay information comprises a step of, after layout designing of said logic circuit, computing a delay time of an arc corresponding to a connection line between a circuit element and each terminal according to a predetermined relational expression based on said arc information of said logic circuit to be processed and the layout of said logic circuit, and said fourth step of extracting the difference information comprises the steps of:
  comparing said first delay information and said second delay information, and
  extracting, as difference information, an arc whose delay time of said second delay information is longer than that of said first delay information according to said comparison results, out of the arcs in said arc information of said logic circuit to be processed.

11. The delay verification method as set forth in claim 8, wherein said second step of storing the first delay information comprises a step of computing a delay time of an arc corresponding to a connection line between a circuit element and each terminal according to a predetermined relational expression based on information of an arc which is a flow of an electric signal between nodes including an external terminal of said logic circuit to be processed and a terminal of each circuit element, said third step of storing the second delay information comprises a step of, after layout designing of said logic circuit, computing a delay time of an arc corresponding to a connection line between a circuit element and each terminal according to a predetermined relational expression based on said arc information of said logic circuit to be processed and the layout of said logic circuit, said fourth step of extracting the difference information comprises the steps of:
comparing said first delay information and said second delay information, and
extracting, as difference information, an arc whose delay time of said second delay information is longer than that of said first delay information according to said comparison results, out of the arcs in said arc information of said logic circuit to be processed, and said fifth step of obtaining the extracted circuit information comprises the steps of:
with respect to an arc extracted as said difference information, searching a path according to said circuit information stored in said circuit information storing means, and
extracting said arc as a circuit element, and a node and an arc as signal path elements on a signal path running through the arc according to the results of said search of the path and correlating the arc and node with a delay time of the arc to output extracted circuit information.

12. A computer readable memory which stores a computer program for controlling a delay verification device for performing delay verification of a logic circuit having circuit elements, said computer program comprising the steps of:

a first step of storing circuit information on said logic circuit as a target for delay verification;

a second step of storing first delay information on a delay time between said circuit elements predicted before layout designing of said logic circuit;

a third step of storing second delay information on a delay time between said circuit elements computed after layout designing of said logic circuit;

a fourth step of comparing said first delay information and said second delay information to extract difference information on a portion of said logic circuit whose delay time of said second delay information is longer than that of said first delay information;

a fifth step of searching a path of said logic circuit based on said circuit information and said difference information, extracting a path including said portion of said logic circuit, and storing the extracted path as extracted circuit information; and a sixth step of analyzing delay of said extracted path using said extracted circuit information.

13. The computer readable memory as set forth in claim 12, wherein in said computer program, said second step of storing the first delay information comprises a step of computing a delay time of an arc corresponding to a connection line between a circuit element and each terminal according to a predetermined relational expression based on information of an arc which is a flow of an electric signal between nodes including an external terminal of said logic circuit to be processed and a terminal of each circuit element, said third step of storing the second delay information comprises a step of, after layout designing of said logic circuit, computing a delay time of an arc corresponding to a connection line between a circuit element and each terminal according to a predetermined relational expression based on said arc information of said logic circuit to be processed and the layout of said logic circuit, said fourth step of extracting the difference information comprises the steps of:
comparing said first delay information and said second delay information, and
extracting, as difference information, an arc whose delay time of said second delay information is longer than that of said first delay information according to said comparison results, out of the arcs in said arc information of said logic circuit to be processed, and said fifth step of obtaining the extracted circuit information comprises the steps of:
with respect to an arc extracted as said difference information, searching a path according to said circuit information stored in said circuit information storing means, and
extracting said arc as a circuit element, and a node and an arc as signal path elements on a signal path running through said arc according to the results of said search of the path and correlating the arc and node with a delay time of the arc to output extracted circuit information.

* * * * *